US 11,171,286 B2

(12) United States Patent
Kubo et al.

(10) Patent No.: US 11,171,286 B2
(45) Date of Patent: Nov. 9, 2021

(54) METHOD OF PROCESSING WORKPIECE (71) Applicant: TOKYO ELECTRON LIMITED, Tokyo (JP)

(72) Inventors: Takuya Kubo, Tokyo (JP); Song yun Kang, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 49 days.

(21) Appl. No.: 16/151,689

(22) Filed: Oct. 4, 2018

(65) Prior Publication Data
US 2019/0109282 A1    Apr. 11, 2019

(30) Foreign Application Priority Data
Oct. 5, 2017    (JP) .............. JP2017194975

(51) Int. Cl.
*H01L 43/12* (2006.01)
*H01L 43/02* (2006.01)
*H01F 41/34* (2006.01)
*H01F 41/30* (2006.01)
*H01L 43/10* (2006.01)
*H01F 10/32* (2006.01)
*G11C 11/16* (2006.01)

(52) U.S. Cl.
CPC .......... *H01L 43/12* (2013.01); *H01F 41/308* (2013.01); *H01F 41/34* (2013.01); *H01L 43/02* (2013.01); *G11C 11/161* (2013.01); *H01F 10/3254* (2013.01); *H01L 43/10* (2013.01)

(58) Field of Classification Search
None
See application file for complete search history.

(56) References Cited

U.S. PATENT DOCUMENTS

2016/0260772 A1*  9/2016  Usami ................. H01L 43/12
2017/0186944 A1*  6/2017  Annunziata ......... H01L 43/12

FOREIGN PATENT DOCUMENTS

| JP | 2008-91484 A | 4/2008 |
| JP | 2013-21129 A | 1/2013 |
| JP | 2016164955 A | 9/2016 |
| JP | 2017-505538 A | 2/2017 |

* cited by examiner

*Primary Examiner* — Alexander G Ghyka
(74) *Attorney, Agent, or Firm* — Nath, Goldberg & Meyer; Jerald L. Meyer; Tanya E. Harkins (57) ABSTRACT There is provided a method of processing a workpiece for manufacturing a magnetoresistive effect element, the workpiece including a first multilayer film and a second multilayer film, the first multilayer film including a first magnetic layer, a second magnetic layer and a tunnel barrier layer formed between the first magnetic layer and the second magnetic layer, and the second multilayer film constituting a pinning layer in the magnetoresistive effect element. The method includes etching the first multilayer film and the second multilayer film, and heating the workpiece after the etching or during the etching. The heating includes heating the workpiece while adjusting an ambient condition of the workpiece.

5 Claims, 8 Drawing Sheets

METHOD OF PROCESSING WORKPIECE

CROSS-REFERENCE TO RELATED APPLICATION

This application is based upon and claims the benefit of priority from Japanese Patent Application No. 2017-194975, filed on Oct. 5, 2017, the entire contents of which are incorporated herein by reference.

TECHNICAL FIELD

The present disclosure relates to a method of processing a workpiece.

BACKGROUND

A magnetoresistive effect element used in a device such as a magnetoresistive random access memory (MRAM) has a magnetic tunnel junction. In the manufacture of the magnetoresistive effect element, etching is performed on a multilayer film. For example, a technique of forming a magnetoresistive effect element constituting MRAM by processing a laminated film including a magnetic layer by dry etching is known.

In a case where a reactive ion etching (RIE) is used to process the magnetoresistive effect element, a reactive gas containing hydrogen, nitrogen, halogen or the like is used for the etching. Accordingly, there is a case where the magnetic characteristics and the like of the magnetoresistive effect element are reduced by the etching. Therefore, there is a need for a technique capable of suppressing a reduction in magnetic characteristics of the magnetoresistive effect element when etching is used to process the magnetoresistive effect element.

SUMMARY

According to one embodiment of the present disclosure, there is provided a method of processing a workpiece for manufacturing a magnetoresistive effect element, the workpiece comprising a first multilayer film and a second multilayer film, the first multilayer film including a first magnetic layer, a second magnetic layer and a tunnel barrier layer formed between the first magnetic layer and the second magnetic layer, and the second multilayer film constituting a pinning layer in the magnetoresistive effect element, the method including: etching the first multilayer film and the second multilayer film; and heating the workpiece after the etching or during the etching, wherein the heating includes heating the workpiece while adjusting an ambient condition of the workpiece.

BRIEF DESCRIPTION OF DRAWINGS

The accompanying drawings, which are incorporated in and constitute a portion of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. Throughout the drawings, the same or similar parts are denoted by the same reference numerals. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
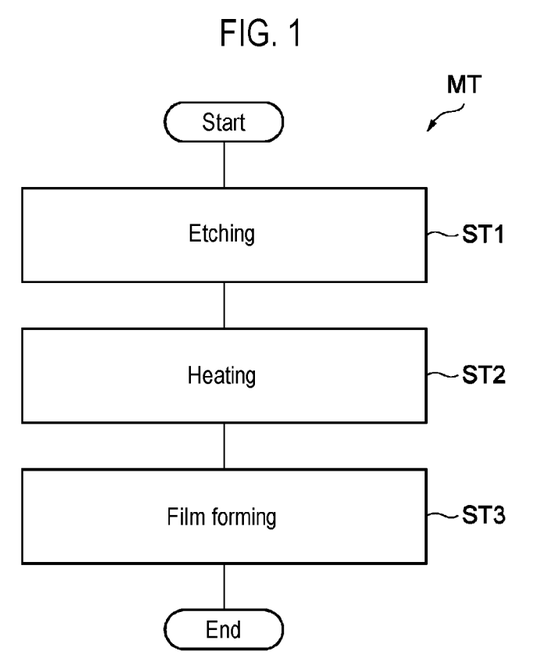
FIG. 1 is a flow diagram illustrating some processes of a workpiece processing method according to one embodiment.

FIG. 1 is a flow diagram illustrating some processes of a method MT of processing a workpiece W according to an embodiment. The method MT illustrated in FIG. 1 is performed to manufacture a magnetoresistive effect element. The method MT includes an etching process ST1, a heating process ST2 and a film-forming process ST3. The heating process ST2 is performed after the etching process ST1. The film-forming process ST3 is performed after the heating process ST2.

Figure 2:
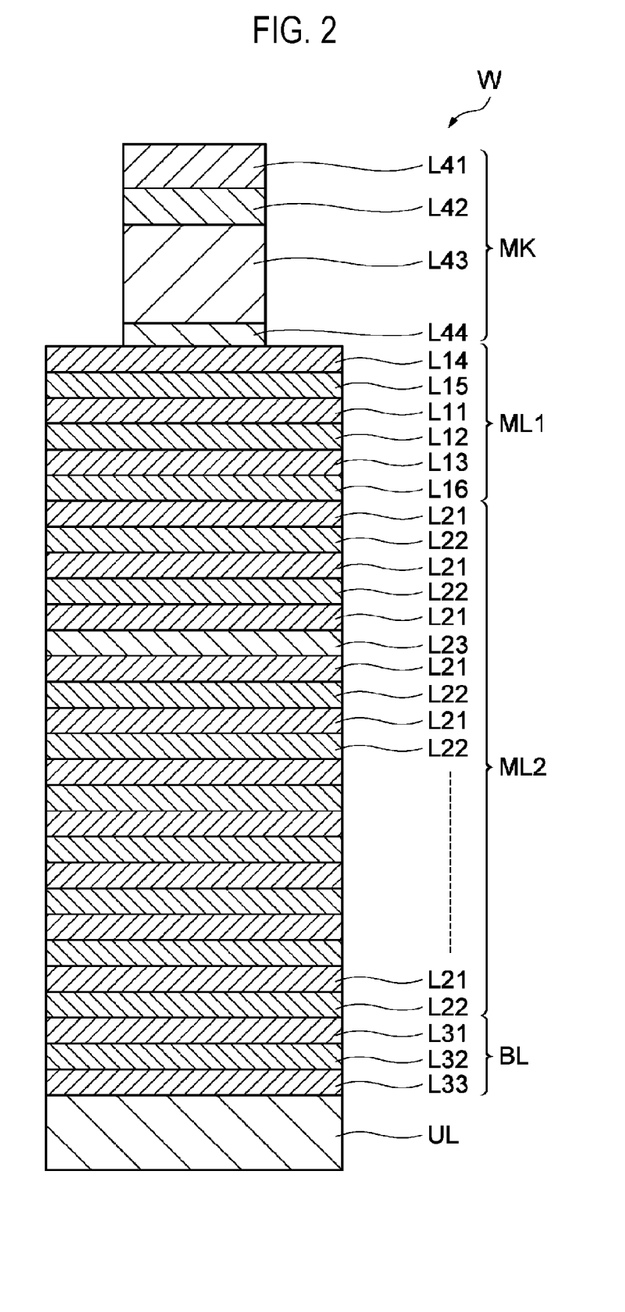
FIG. 2 is a cross-sectional view illustrating a portion of a workpiece to which an etching process of the method illustrated in FIG. 1 is applied.
Figure 3:
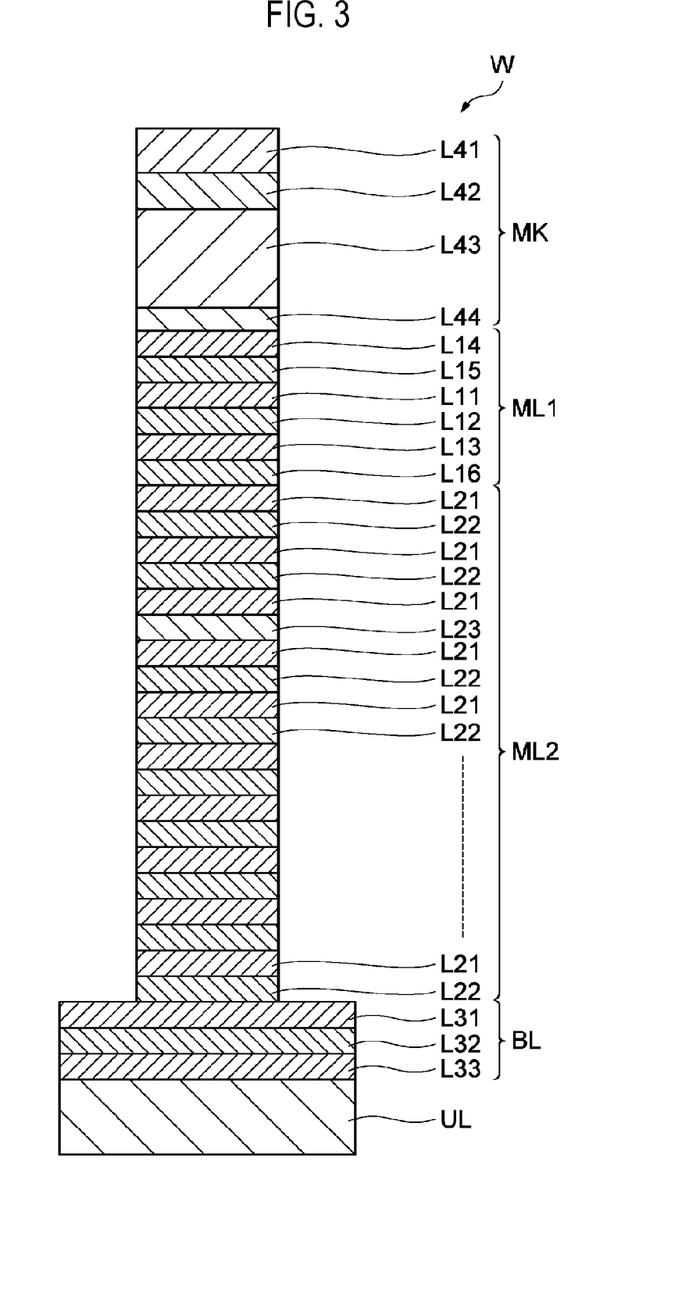
FIG. 3 is a cross-sectional view illustrating a portion of a workpiece to which a heating process of the method illustrated in FIG. 1 is applied.

The etching process ST1 is performed to etch a workpiece W, for example, in a state illustrated in FIG. 2. FIG. 2 is a cross-sectional view illustrating a portion of the workpiece W to which the etching process ST1 of the method MT illustrated in FIG. 1 is applied. FIG. 3 is a cross-sectional view illustrating a portion of the workpiece W to which the heating process ST2 of the method MT illustrated in FIG. 1 is applied.

The configuration of the workpiece W will be described in detail with reference to FIGS. 2 and 3. The workpiece W includes a multilayer film ML1 (a first multilayer film) and a multilayer film ML2 (a second multilayer film). The multilayer film ML1 includes a first magnetic layer L11, a tunnel barrier layer L12 and a second magnetic layer L13. The tunnel barrier layer L12 is formed between the first magnetic layer L11 and the second magnetic layer L13. A combination of the first magnetic layer L11, the tunnel barrier layer L12 and the second magnetic layer L13 forms a magnetic tunnel junction in the magnetoresistive effect element. The first magnetic layer L11 and the second magnetic layer L13 are, for example, CoFeB layers. The tunnel barrier layer L12 is an insulating layer containing metal oxide. The tunnel barrier layer L12 is, for example, a magnesium oxide (MgO) layer.

As an example, the multilayer film ML1 further includes a cap layer L14, an upper layer L15 and a lower layer L16. The first magnetic layer L11, the tunnel barrier layer L12 and the second magnetic layer L13 are formed between the upper layer L15 and the lower layer L16. The upper layer L15 and the lower layer L16 contain, for example, tungsten (W). The cap layer L14 is formed on the upper layer L15. The cap layer L14 contains, for example, tantalum (T).

A CoFeB layer and an MgO layer may be formed between the cap layer L14 and the upper layer L15. In this case, the CoFeB layer is formed on the cap layer L14, the MgO layer is formed on the CoFeB layer, and the upper layer L15 is formed on the MgO layer.

The multilayer film ML2 is formed on the multilayer film ML1. The multilayer film ML2 is a metal multilayer film and is a multilayer film constituting a pinning layer in the magnetoresistive effect element. As an example, the multilayer film ML2 includes a plurality of cobalt layers L21 and a plurality of platinum layers L22. The plurality of cobalt layers L21 and the plurality of platinum layers L22 are alternately stacked on top of each other. The multilayer film ML2 may further include a ruthenium (Ru) layer L23. The ruthenium layer L23 is formed between alternately laminated bodies of the plurality of cobalt layers L21 and the plurality of platinum layers L22.

The multilayer film ML1 and the multilayer film ML2 are formed on an underlayer UL via a lower electrode layer BL. The underlayer UL is made of, for example, silicon oxide. As an example, the lower electrode layer BL includes a first layer L31, a second layer L32 and a third layer L33. The third layer L33 is a Ta layer and is formed on the underlayer UL. The second layer L32 is a Ru layer and is formed on the third layer L33. The first layer L31 is a Ta layer and is formed on the second layer L32.

A mask MK is formed on a laminated body of the multilayer film ML1 and the multilayer film ML2. The mask MK is configured as the laminated body as in the examples illustrated in FIGS. 2 and 3 but may be configured as a single layer. In the examples illustrated in FIGS. 2 and 3, the mask MK includes layers L41 to L44. The layer L41 contains silicon oxide, the layer L42 contains silicon nitride, the layer L43 contains titanium nitride (TiN), and the layer L44 contains ruthenium (Ru).

Figure 4:
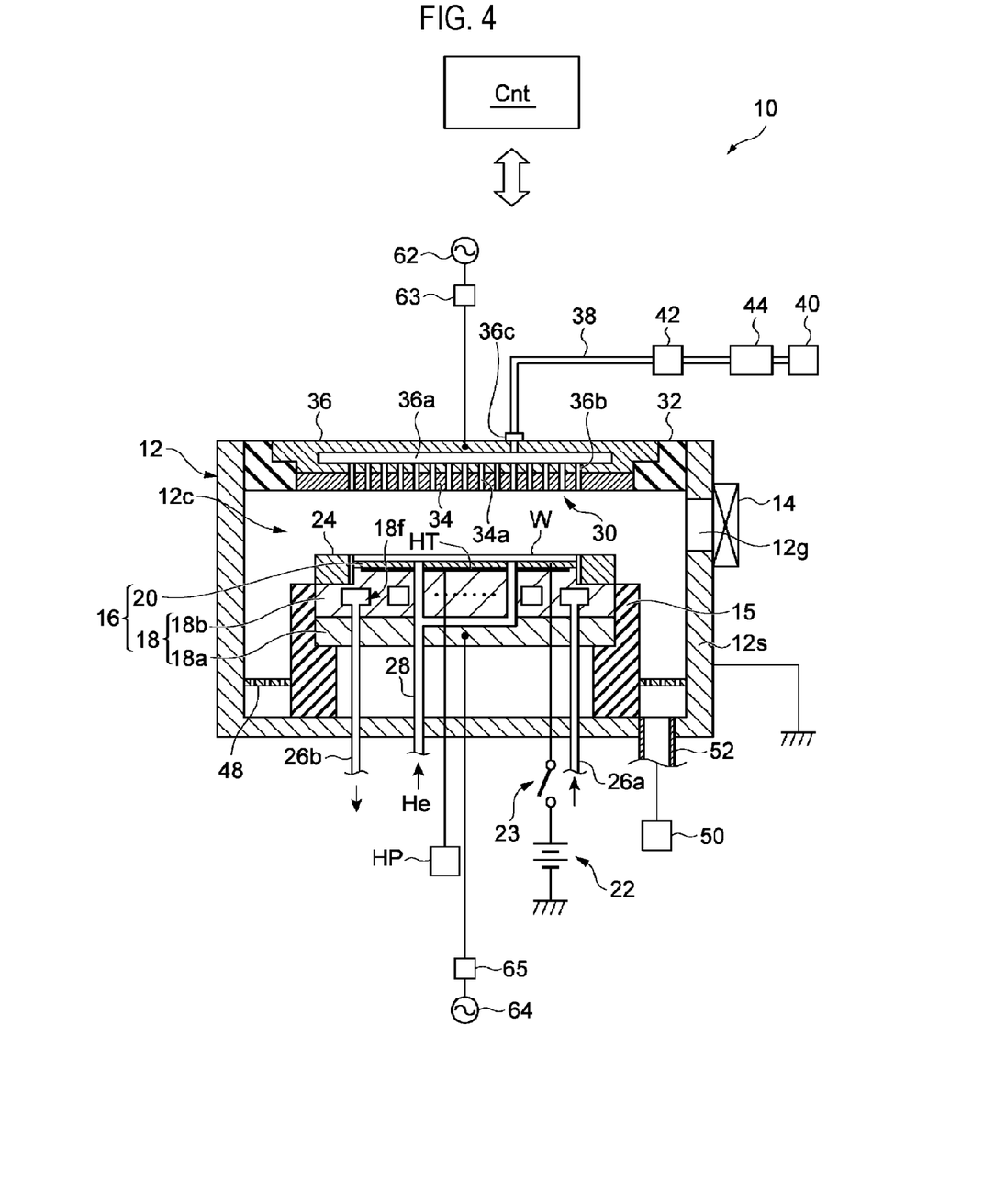
FIG. 4 is a view schematically illustrating an example of a plasma processing apparatus that can be used to perform the heating process illustrated in FIG. 1.

Hereinafter, the method MT will be described by way of an example in which the method MT is applied to the workpiece W illustrated in each of FIGS. 2 and 3. The method MT uses a plasma processing apparatus to etch the multilayer film ML1 and the multilayer film ML2 of the workpiece W. FIG. 4 is a view schematically illustrating an example of a plasma processing apparatus 10 that can be used to perform the method MT (particularly, the heating process ST2) illustrated in FIG. 1. FIG. 4 schematically illustrates a longitudinal sectional structure of the plasma processing apparatus 10. The plasma processing apparatus 10 illustrated in FIG. 4 is a capacitively-coupled plasma processing apparatus. The plasma processing apparatus 10 can be used to perform the heating process ST2 and can be also used to perform the etching process ST1 and the film-forming process ST3. In this case, all of the etching process ST1, the heating process ST2 and the film-forming process ST3 can be performed by a single apparatus (the plasma processing apparatus 10). In some embodiments, the etching process ST1 and the film-forming process ST3 may be performed by another plasma processing apparatus that is different from the plasma processing apparatus 10.

The plasma processing apparatus 10 includes a chamber main body 12. The chamber main body 12 has a substantially cylindrical shape. An internal space of the chamber main body 12 is defined as a chamber 12c. The chamber main body 12 is made of, for example, aluminum. A plasma-resistant film is formed on an inner wall surface of the chamber main body 12, namely a wall surface defining the chamber 12c. This film may be a film formed by an anodic oxidation, or a film made of ceramics. Such a ceramic-made film is, for example, a film containing yttrium oxide. An opening 12g through which the workpiece W is transferred is formed in a side wall 12s of the chamber main body 12. The opening 12g is opened and closed by a gate valve 14. The chamber main body 12 is connected to a ground potential.

In the chamber 12c, a support part 15 extends upward from the bottom of the chamber main body 12. The support part 15 has a substantially cylindrical shape and is made of an insulating material such as quartz. A stage 16 is installed inside the chamber 12c. The stage 16 is configured to support the workpiece W mounted on the stage 16. The workpiece W may have a disk shape, like a wafer. The stage 16 includes a lower electrode 18 and an electrostatic chuck 20. The stage 16 is supported by the support part 15.

The lower electrode 18 includes a first plate 18a and a second plate 18b. The first plate 18a and the second plate 18b contain metal such as aluminum and have a substantially disc shape. The second plate 18b is placed on the first plate 18a and is electrically connected to the first plate 18a.

The electrostatic chuck 20 is placed on the second plate 18b. The electrostatic chuck 20 includes an insulating layer and an electrode built in the insulating layer. A DC power supply 22 is electrically coupled to the electrode of the electrostatic chuck 20 via a switch 23. When a DC voltage from the DC power supply 22 is applied to the electrode of the electrostatic chuck 20, the electrostatic chuck 20 generates an electrostatic force. The electrostatic chuck 20 attracts and holds the workpiece W by virtue of the electrostatic force.

A focus ring 24 is disposed on the periphery of the second plate 18b so as to surround the edge of the workpiece W and the electrostatic chuck 20. The focus ring 24 is provided to improve the uniformity of plasma treatment. The focus ring 24 is made of a material appropriately selected depending on the plasma treatment, such as quartz.

The workpiece W mounted on the electrostatic chuck 20 is controlled by a chiller unit for supplying a refrigerant to a flow path 18f, and a heater power supply HP for supplying electric power to a temperature regulator HT.

The flow path 18f is formed inside the second plate 18b. The refrigerant is supplied to the flow path 18f from the chiller unit installed outside the chamber main body 12 via a pipe 26a. The refrigerant supplied to the flow path 18f is returned to the chiller unit via a pipe 26b. In this manner, the refrigerant is supplied to the flow path 18f so that the refrigerant circulates throughout the flow path 18f. The temperature of the refrigerant is controlled by the chiller unit so that the temperature of the workpiece W supported by the electrostatic chuck 20 can be controlled.

The temperature regulator HT is installed on the electrostatic chuck 20. The heater power supply HP is connected to the temperature regulator HT. When electric power is supplied from the heater power supply HP to the temperature regulator HT, the temperature of the electrostatic chuck 20 is regulated so that the temperature of the workpiece W mounted on the electrostatic chuck 20 is regulated. The temperature regulator HT may be built in the second plate 18b.

The temperature regulator HT includes a temperature sensor (not shown) which detects the ambient temperature of the temperature regulator HT and outputs the same as a detection signal to a control part Cnt. The temperature detected by the temperature sensor is equal to the temperature of the workpiece W mounted on the electrostatic chuck 20.

A gas supply line 28 is installed in the plasma processing apparatus 10. The gas supply line 28 supplies a heat transfer gas, for example, a He gas, from a heat transfer gas supply mechanism between the upper surface of the electrostatic chuck 20 and the back surface of the workpiece W.

The plasma processing apparatus 10 further includes an upper electrode 30. The upper electrode 30 is installed above the stage 16 in a mutually parallel relationship with the lower electrode 18. The upper electrode 30 closes an upper opening of the chamber main body 12 together with a member 32. The member 32 has an insulating property. The upper electrode 30 is supported on the upper portion of the chamber main body 12 via the member 32.

The upper electrode 30 includes a ceiling plate 34 and a support member 36. The ceiling plate 34 faces the chamber 12c. A plurality of gas discharge holes 34a is formed in the ceiling plate 34. The ceiling plate 34 is made of, for example, silicon, but not limited thereto. For example, the ceiling plate 34 may have a structure in which a plasma-resistant film is formed on an aluminum-made base material. The plasma-resistant film may be a film made of ceramics. The film made of ceramics is a film formed by anodic oxidation, a film containing yttrium oxide, or the like.

The support member 36 supports the ceiling plate 34 in a detachable manner. The support member 36 is made of a conductive material such as aluminum. A gas diffusion chamber 36a is defined inside the support member 36. A plurality of gas holes 36b is formed to extend downward from the gas diffusion chamber 36a. The plurality of gas holes 36b is in communication with the plurality of gas discharge holes 34a, respectively. A gas introduction port 36c for guiding a gas to the gas diffusion chamber 36a is formed in the support member 36. A gas supply pipe 38 is connected to the gas introduction port 36c.

A gas source group 40 is coupled to the gas supply pipe 38 via a valve group 42 and a flow rate controller group 44. The gas source group 40 includes a plurality of gas sources. The plurality of gas sources includes at least a source of one or more noble gases, a source of hydrocarbon gas, a source of gas containing carbon and oxygen, a source of $O_2$ gas and a source of He gas. The plurality of gas sources may include a source of Ne gas and a source of Kr gas as the source of one or more noble gases. The plurality of gas sources may further include a source of Ar gas as the source of one or more noble gases. The hydrocarbon gas is, for example, a $CH_4$ gas. The gas containing carbon and oxygen is, for example, a carbon monoxide gas, a carbon dioxide gas, a $CF_4$ gas, or the like.

The valve group 42 includes a plurality of valves. The flow rate controller group 44 includes a plurality of flow rate controllers such as mass flow controllers. The plurality of gas sources of the gas source group 40 is coupled to the gas supply pipe 38 via respective valves of the valve group 42 and respective flow rate controllers of the flow rate controller group 44. The plasma processing apparatus 10 is capable of supplying gases from one or more gas sources selected among the plurality of gas sources of the gas source group 40 to the chamber 12c at individually adjusted flow rates.

A baffle plate 48 is installed between the support part 15 and the side wall 12s of the chamber main body 12 inside the chamber 12c. The baffle plate 48 has a configuration in which ceramics such as yttrium oxide is coated on a base material made of aluminum. A plurality of through-holes is formed in the baffle plate 48. An exhaust pipe 52 is installed under the baffle plate 48 and is connected to the bottom of the chamber main body 12. An exhaust device 50 is connected to the exhaust pipe 52. The evacuation device 50 includes a pressure controller and a vacuum pump such as a turbo molecular pump, so that the chamber 12c can be depressurized.

The plasma processing apparatus 10 includes a first high frequency power supply 62. The first high frequency power supply 62 is a power supply for generating a first high frequency for plasma generation which has a frequency within a range of 27 to 100 [MHz], for example, a frequency of 60 [MHz]. The first high frequency power supply 62 is coupled to the upper electrode 30 via a matching device 63. The matching device 63 includes a circuit for taking an impedance matching between an output impedance of the first high frequency power supply 62 and an input impedance at a load side (the side of the upper electrode 30). The first high frequency power supply 62 may be coupled to the lower electrode 18 via the matching device 63. In the case where the first high frequency power supply 62 is coupled to the lower electrode 18, the upper electrode 30 is connected to the ground potential.

The plasma processing apparatus 10 includes a second high frequency power supply 64. The second high frequency power supply 64 is a power supply for generating a second high frequency for bias for pulling ions to the workpiece W. The second high frequency is lower than the first high frequency. The frequency of the second high frequency is a frequency within a range of 400 [kHz] to 13.56 [MHz], for example, 400 [kHz]. The second high frequency power supply 64 is coupled to the lower electrode 18 via a matching device 65. The matching device 65 includes a circuit for taking an impedance matching between an output impedance of the second high frequency power supply 64 and an input impedance at a load side (the side of the lower electrode 18).

In one embodiment, the plasma processing apparatus 10 includes the control part Cnt. The control part Cnt is a computer including a processor, a storage device, an input device, a display device and the like, and controls each part of the plasma processing apparatus 10. Specifically, the control part Cnt executes a control program stored in the storage device to control each part of the plasma processing apparatus 10 based on recipe data stored in the storage device. Thus, the plasma processing apparatus 10 executes the process specified by the recipe data.

The control part Cnt controls each part of the plasma processing apparatus 10 based on, for example, a recipe data for the method MT. Particularly, based on a detection signal (signal indicating the result of temperature detection) outputted from the temperature sensor of the temperature regulator HT, the control part Cnt controls the heater power supply HP and the chiller unit so that an ambient temperature of the temperature regulator HT, namely a temperature of the workpiece W mounted on the electrostatic chuck 20, falls within a preset temperature range (TR).

When plasma is used to execute the method MT, during the execution of the method MT, a gas from one selected among the plurality of gas sources of the gas source group 40 is supplied into the chamber 12c. In addition, the chamber 12c is depressurized by the exhaust device 50. Then, the gas supplied into the chamber 12c is excited by a high frequency electric field generated by the high frequency provided from the first high frequency power supply 62. As a result, plasma is generated inside the chamber 12c. Further, there is a case where the second high frequency is supplied to the lower electrode 18. In this case, ions in the plasma are accelerated toward the workpiece W.

Returning to FIG. 1, the method MT will be described. The etching process ST1 is executed to etch the workpiece W in the state illustrated in FIG. 2. More specifically, the etching process ST1 etches the multilayer film ML1 and the multilayer film ML2 illustrated in FIG. 2. By executing the etching process ST2, the workpiece W in the state illustrated in FIG. 2 is shaped into a workpiece W in a state illustrated in FIG. 3, for example.

The etching process ST1 will be described in detail. In the etching process ST1, plasma of a noble gas such as a Kr gas may be used to etch the multilayer film ML1. In the etching process ST1, for example, plasma of a first mixed gas including a hydrocarbon gas and a noble gas may be used to etch the multilayer film ML2. The hydrocarbon gas contained in the first mixed gas is, for example, a $CH_4$ gas. The noble gas contained in the first mixed gas is, for example, a Kr gas. When the first mixed gas is used, deposits containing carbon may be formed on the workpiece W. The deposits can be removed using plasma of a second mixed gas. The second mixed gas is a mixture of a gas containing carbon and oxygen, a gas containing $O_2$, a noble gas and a hydrogen-free gas. For example, the gas containing carbon and oxygen, which is contained in the second mixed gas, is a carbon monoxide gas and/or a carbon dioxide gas. The noble gas contained in the second mixed gas is, for example, a Ne gas.

The heating process ST2 following the etching process ST1 heats the workpiece W in the state illustrated in FIG. 3. More specifically, the heating process ST2 heats the workpiece W while adjusting the ambient condition of the workpiece W in the state illustrated in FIG. 3. The workpiece W is heated by the temperature regulator HT supplied with the electric power from the heater power supply HP. The film-forming process ST3 following the heating process ST2 forms, for example, a film containing SiN on the workpiece W which has been subjected to the heating process ST2.

The heating process ST2 will be described in detail. In the heating process ST2, the temperature of the workpiece W mounted on the electrostatic chuck 20 is controlled using the chiller unit that supplies the refrigerant to the flow path 18f and the heater power supply HP that supplies the electric power to the temperature regulator HT so that the temperature of the workpiece W falls within the preset temperature range TR. The temperature range TR may be, for example, one of a range of 160 degrees C. or more to 200 degrees C. or less, and a range of 160 degrees C. or more to 180 degrees C. or less. That is to say, the heating process ST2 controls the temperature of the workpiece W by heating the workpiece W such that the temperature of the workpiece W falls within the above temperature range TR.

The heating process ST2 adjusts the ambient condition of the workpiece W while heating the workpiece W. Specifically, for example, the heating process ST2 heats (vacuum-heats) the workpiece W in a vacuum atmosphere. The vacuum-heating means heating the workpiece W under a state where an ambient pressure of the workpiece W is sufficiently depressurized by the exhaust device 50. In addition, for example, the heating process ST2 may vacuum-heat the workpiece W during the execution of the etching process ST1. Further, the heating process ST2 may heat the workpiece W while adjusting the ambient condition of the workpiece W by supplying a gas around the workpiece W without performing the vacuum-heating after the execution of the etching process ST1. The gas supplied around the workpiece W may be a gas containing various elements. As an example, the gas supplied around the workpiece W may include one of a hydrogen gas and a noble gas.

Figure 5:
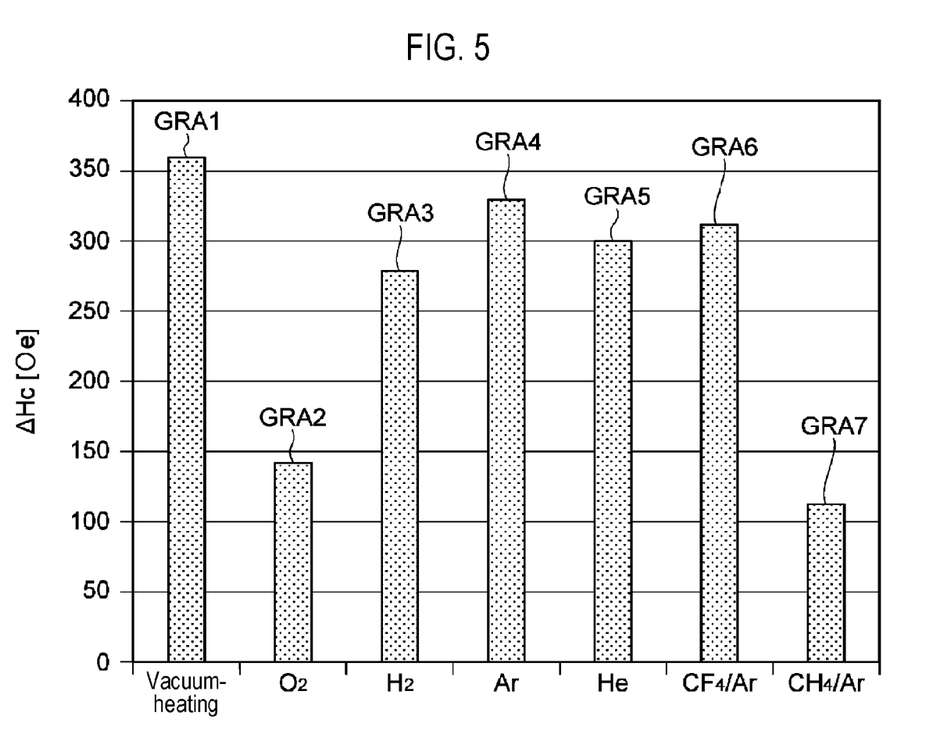
FIG. 5 is a view illustrating a correlation between an ambient condition of the workpiece in the heating process of the method illustrated in FIG. 1 and a variation of a coercive force of the workpiece before and after the heating process.

FIG. 5 is a view illustrating a correlation between the ambient condition of the workpiece W in the heating process ST2 of the method MT illustrated in FIG. 1 and a variation ΔHc [Oe] of a coercive force Hc [Oe] of the workpiece W before and after the heating process ST2. In FIG. 5, the horizontal axis represents the ambient condition of the workpiece W and the vertical axis represents the variation ΔHc [Oe] of the coercive force Hc [Oe] of the workpiece W before and after the heating process ST2. In the present disclosure, the variation ΔHc [Oe] is a value obtained by subtracting a coercive force Hc [Oe] before the execution of the heating process ST2 from a coercive force Hc [Oe] after the execution of the heating process ST2.

In FIG. 5A, a bar GRA1 represents a variation ΔHc [Oe] of a coercive force Hc [Oe] of the workpiece W before and after the heating process ST2 in a case where the ambient condition of the workpiece W in the heating process ST2 is in vacuum, namely a case where the ambient pressure of the workpiece W is sufficiently depressurized by the exhaust device 50. A bar GRA2 represents a variation ΔHc [Oe] of a coercive force Hc [Oe] of the workpiece W before and after the heating process ST2 in a case where the ambient condition of the workpiece W in the heating process ST2 is under an $O_2$ gas atmosphere. A bar GRA3 represents a variation ΔHc [Oe] of a coercive force Hc [Oe] of the workpiece W before and after the heating process ST2 in a case where the ambient condition of the workpiece W in the heating process ST2 is under a $H_2$ gas atmosphere.

A bar GRA4 represents a variation ΔHc [Oe] of a coercive force Hc [Oe] of the workpiece W before and after the heating process ST2 in a case where the ambient condition of the workpiece W in the heating process ST2 is under an Ar gas atmosphere. A bar GRA5 represents a variation ΔHc [Oe] of a coercive force Hc [Oe] of the workpiece W before and after the heating process ST2 in a case where the ambient condition of the workpiece W in the heating process ST2 is under a He gas atmosphere. A bar GRA6 represents a variation ΔHc [Oe] of a coercive force Hc [Oe] of the workpiece W before and after the heating process ST2 in a case where the ambient condition of the workpiece W in the heating process ST2 is under a mixed gas ($CF_4$/Ar gas) atmosphere including a $CF_4$ gas and an Ar gas. A bar GRA7 represents a variation ΔHc [Oe] of a coercive force Hc [Oe] of the workpiece W before and after the heating process ST2 in a case where the ambient condition of the workpiece W in the heating process ST2 is under a mixed gas ($CH_4$/Ar gas) atmosphere including a $CH_4$ gas and an Ar gas.

FIG. 5 shows the results obtained by executing the heating process ST2 under the following conditions as an example. It is also possible to obtain the same results as those shown in FIG. 5 by executing the heating process ST2 under a relatively wide condition including the following conditions.

<Conditions of Heating Process ST2>
Temperature of workpiece W: 200 degrees C.
Execution time: 600 seconds As illustrated in FIG. 5, in the heating process ST2, either when the workpiece W is vacuum-heated or when the workpiece W is overheated in a state where the ambient condition of the workpiece W is under one of the atmospheres of $O_2$ gas, $H_2$ gas, Ar gas, He gas, $CF_4$/Ar gas and $CH_4$/Ar gas, the variation ΔHc [Oe] of the coercive force Hc [Oe] of the workpiece W before and after the heating process ST2 is approximately 100 [Oe] or more. Therefore, it can be seen that the coercive force Hc [Oe] of the workpiece W is sufficiently restored by the execution of the heating process ST2.

Figure 6:
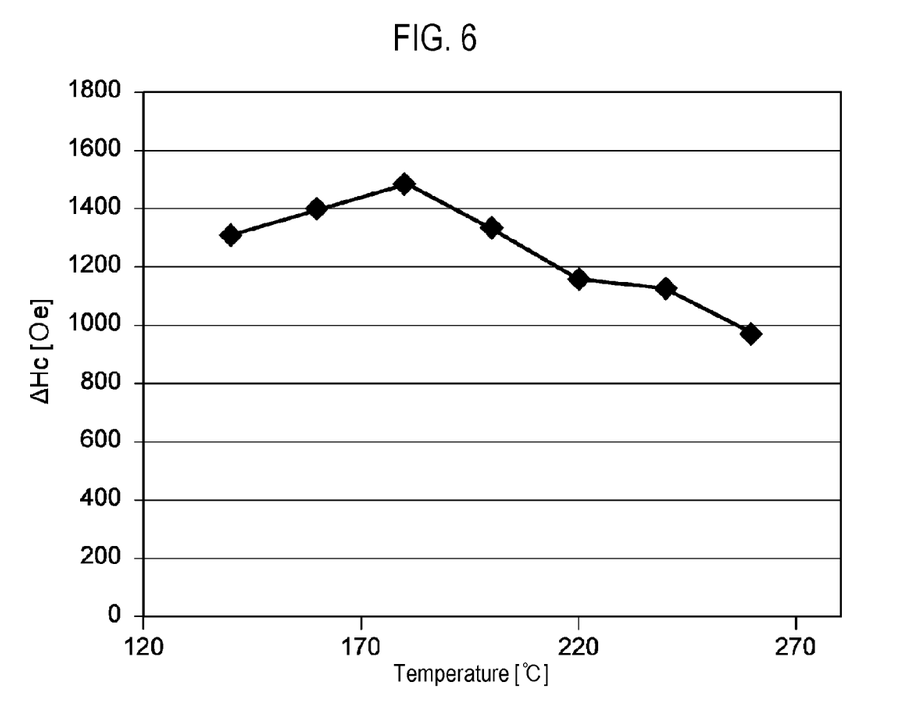
FIG. 6 is a view illustrating a correlation between a temperature of the workpiece in the heating process of the method illustrated in FIG. 1 and a coercive force of the workpiece before and after the heating process.

FIG. 6 is a view illustrating a correlation between the temperature [degrees C.] of the workpiece W in the heating process ST2 of the method MT illustrated in FIG. 1 and a coercive force Hc [Oe] of the workpiece W before and after the heating process ST2. In FIG. 6, the horizontal axis represents the temperature [degrees C.] of the workpiece W and the vertical axis represents the coercive force Hc [Oe] of the workpiece W before and after the heating process ST2. FIG. 6 illustrates the results obtained by executing the heating process ST2 in a state where the ambient condition of the workpiece W is under the Ar gas atmosphere.

As can be seen from FIG. 6, in the state where the heating process ST2 is executed in the state where the ambient condition of the workpiece W is under the Ar gas atmosphere, the coercive force Hc [Oe] of the workpiece W before and after the heating process ST2 is approximately equal to or greater than 1,300 [Oe] when the temperature of the workpiece W in the heating process ST2 falls within a range of 160 degrees C. or more to 200 degrees C. or less, and the coercive force Hc [Oe] of the workpiece W before and after the heating process ST2 is approximately equal to or greater than 1,400 [Oe] when the temperature of the workpiece W in the heating process ST2 falls within a range of 160 degrees C. or more to 180 degrees C. or less. Therefore, it can be seen that, when the heating process ST2 is executed in the state where the ambient condition of the workpiece W is under the Ar gas atmosphere, the workpiece W has a sufficient coercive force Hc [Oe].

Although FIG. 6 illustrates the results obtained when the Ar gas is used, the present disclosure is not limited thereto. For example, even when the ambient condition of the workpiece W is under various states as illustrated in the horizontal axis of FIG. 5, the same results as those in FIG. 6 can be obtained by executing the heating process ST2.

Figure 7:
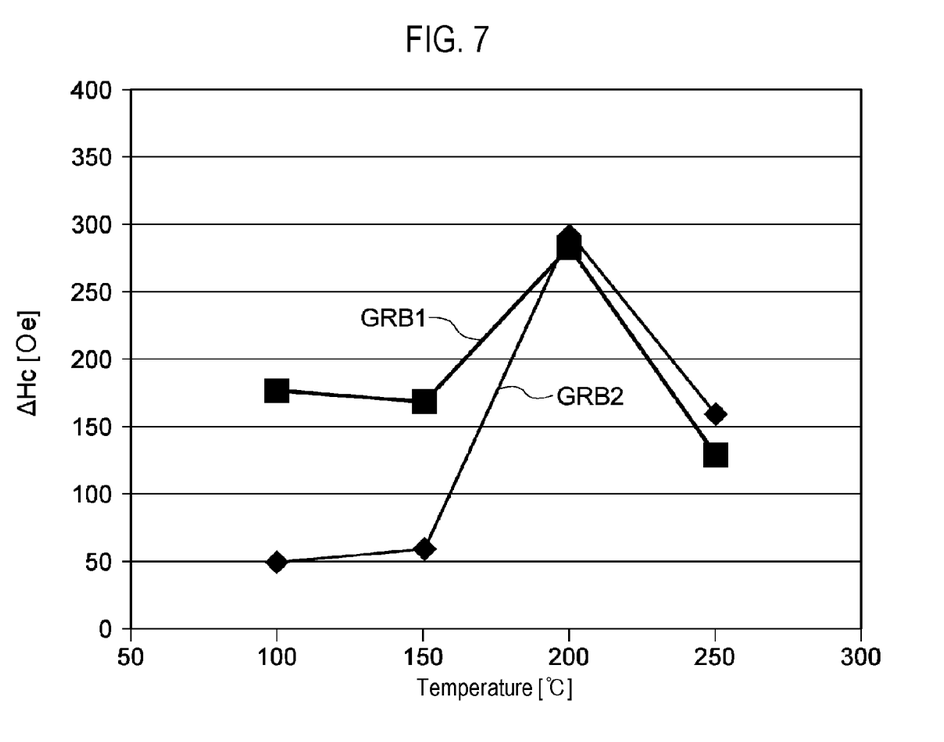
FIG. 7 is a view illustrating the correlation between a temperature of the workpiece in the heating process and a variation of a coercive force of the workpiece before and after the heating process, in a case where plasma is used in the heating process of the method illustrated in FIG. 1.

In the heating process ST2, plasma may be used in adjusting the ambient condition of the workpiece W. That is to say, the heating process ST2 can adjust the ambient condition of the workpiece W by generating the plasma of a gas supplied around the workpiece W. FIG. 7 is a view illustrating a correlation between the temperature of the workpiece W in the heating process ST2 and the variation ΔHc [Oe] of the coercive force Hc [Oe] of the workpiece W before and after the heating process ST2 when plasma is used in the heating process ST2 of the method MT illustrated in FIG. 1. In FIG. 7, the horizontal axis represents the temperature [degrees C.] of the workpiece W and the vertical axis represents a variation ΔHc [Oe] of a coercive force Hc [Oe] of the workpiece W before and after the heating process ST2. FIG. 7 shows the results obtained by executing the heating process ST2 in a state where the ambient condition of the workpiece W is under the $O_2$ gas atmosphere. In FIG. 7, a polygonal line GRB1 represents a case where plasma is used to adjust the ambient condition of the workpiece W. A polygonal line GRB2 represents a case where no plasma is used to adjust the ambient condition of the workpiece W.

As can be seen from FIG. 7, in either when the plasma of $O_2$ gas is used to adjust the ambient condition of the workpiece W or when the $O_2$ gas is used but no plasma of $O_2$ gas is used to adjust the ambient condition of the workpiece W, the variation of the coercive force Hc [Oe] of the workpiece W before and after the heating process ST2 is approximately 70 [Oe] or less when the temperature of the workpiece W in the heating process ST2 falls within a range of 160 degrees C. or more to 200 degrees C. or less. The variation is relatively small regardless of the presence or absence of plasma. Therefore, in the heating process ST2, even when plasma is used to adjust the ambient condition of the workpiece W, it can be seen that the coercive force Hc [Oe] of the workpiece W can be sufficiently restored by executing the heating process ST2. Although FIG. 7 illustrates the results obtained when the $O_2$ gas is used, the present disclosure is not limited to the $O_2$ gas with respect to the presence or absence of plasma. For example, even when various gases as illustrated in the horizontal axis of FIG. 5 are used, the same results as those illustrated in FIG. 7 can be obtained.

Figure 8:
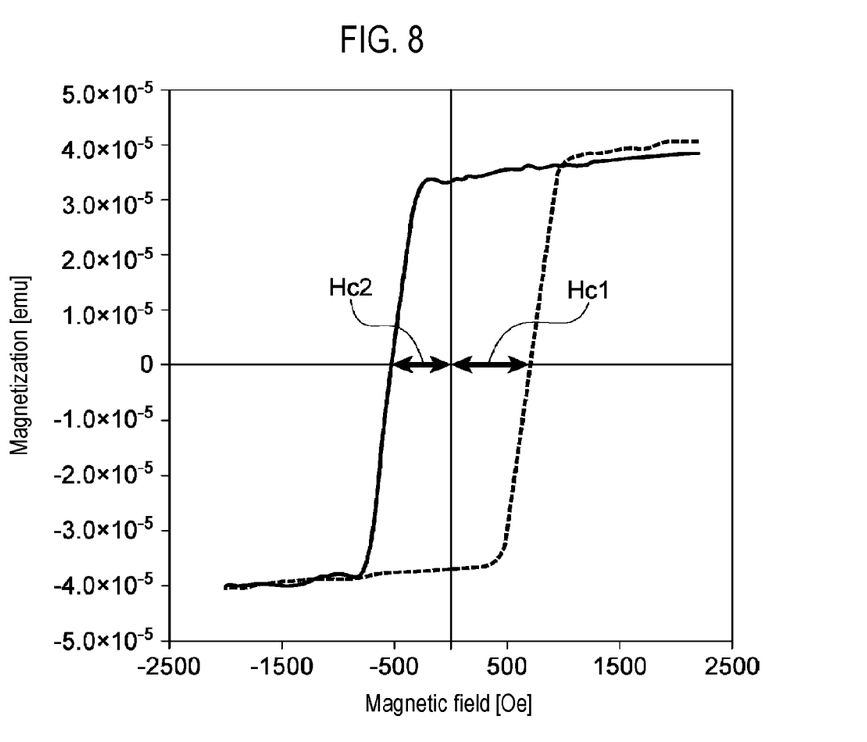
FIG. 8 is a view for explaining a coercive force.

The coercive forces Hc [Oe] illustrated in FIGS. 5, 6 and 7 are values obtained as follows. Specifically, for each workpiece W, a sample vibration type magnetometer was used to create a magnetization curve as schematically illustrated in FIG. 8, measure magnetic field intensities Hc1 and Hc2 based on the magnetization curve, and calculate the average of the measured Hc1 and Hc2 as a coercive force Hc [Oe]. FIG. 8 is a view for explaining the coercive force Hc [Oe] used in the present disclosure.

It should be noted that the heating process ST2 can be performed not only after the execution of the etching process ST1 but also during the execution of the etching process ST1. That is to say, the heating process ST2 can heat the workpiece W after the execution of the etching (the etching process ST1) on the multilayer film ML1 and the multilayer film ML2 or during the execution of the etching (the etching process ST1). Even when the heating process ST2 is performed during the execution of the etching process ST1, the same effects as in the case where the heating process ST2 is performed after the execution of the etching process ST1 can be achieved.

The etching of the multilayer film ML1 and the multilayer film ML2 of the workpiece W in the manufacture of the magnetoresistive effect element changes physical properties such as magnetic characteristics of the workpiece W. This may cause a reduction in the coercive force Hc [Oe]. As a result of intensive research, the present inventors have found that the reduction in the coercive force Hc [Oe] that may be caused by etching can be sufficiently restored by executing the heating process ST2 to heat the workpiece W while adjusting the ambient condition of the workpiece W after the execution of the etching process ST1 on the multilayer film ML1 and the multilayer film ML2 of the workpiece W or during the execution of the etching process ST1.

Further, in the heating process ST2, it is possible to vacuum-heat the workpiece W after the execution of the etching process ST1 or during the execution of the etching process ST1. Alternatively, in the heating process ST2, it is possible to heat the workpiece W while adjusting the ambient condition of the workpiece W by supplying a gas around the workpiece W after the execution of the etching process ST1. In this way, as a result of intensive research, the present inventors have found that, in the heating process ST2, the reduction in the coercive force Hc [Oe] that may be caused by etching can be sufficiently restored either when vacuum-heating the workpiece W after the execution of the etching process ST1 or during the execution of the etching process ST1, or when heating the workpiece W while adjusting the ambient condition of the workpiece W by supplying a gas around the workpiece W after the execution of the etching process ST1.

The gas supplied around the workpiece W after the execution of the etching process ST1 can include one of a hydrogen gas and a noble gas. In this way, the present inventors have found that the reduction in the coercive force Hc [Oe] that may be caused by etching can be sufficiently restored even when the gas supplied around the workpiece W in the heating process ST2 includes one of, for example, a hydrogen gas and a noble gas.

The heating process ST2 can adjust the ambient condition of the workpiece W by generating the plasma of a gas supplied around the workpiece W after the execution of the etching process ST1. In this way, the present inventors have found that the reduction in the coercive force Hc [Oe] that may be caused by etching can be sufficiently restored even when plasma is used to adjust the ambient condition of the workpiece W.

The heating process ST2 can heat the workpiece W such that the temperature of the workpiece W falls within a range of 160 degrees C. or more to 200 degrees C. or less. Alternatively, the heating process ST2 can heat the workpiece W such that the temperature of the workpiece W falls within a range of 160 degrees C. or more to 180 degrees C. or less. In this way, the present inventors have found that, in the heating process ST2, the reduction in the coercive force Hc [Oe] that may be caused by etching can be sufficiently restored either when the temperature of the workpiece W falls within a range of 160 degrees C. or more to 200 degrees C. or less or when the temperature of the workpiece W falls within a range of 160 degrees C. or more to 180 degrees C. or less.

According to the present disclosure in some embodiments, it is possible to provide a technique capable of suppressing a reduction in magnetic characteristics and the like of a magnetoresistive effect element when etching is used in the processing of the magnetoresistive effect element.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a workpiece for manufacturing a magnetoresistive effect element, the workpiece comprising a first multilayer film and a second multilayer film, the first multilayer film including a first magnetic layer, a second magnetic layer and a tunnel barrier layer formed between the first magnetic layer and the second magnetic layer, and the second multilayer film constituting a pinning layer in the magnetoresistive effect element, the method comprising:
    etching the workpiece;
    terminating the etching of the workpiece;
    in a state in which the etching of the workpiece is terminated, subsequently heating the workpiece for a predetermined time so that a temperature of the workpiece falls within a range of 160 degrees C. or more to 200 degrees C. or less; and
    after the lapse of the predetermined time, subsequently initiating a film formation on the workpiece,
    wherein the heating includes heating the workpiece while adjusting an ambient condition of the workpiece, and
    wherein no plasma is used during the heating.

2. The method of claim 1, wherein the heating includes vacuum-heating the workpiece in a vacuum atmosphere.

3. The method of claim 1, wherein the heating includes adjusting the ambient condition of the workpiece by supplying a gas around the workpiece after the etching.

4. The method of claim 3, wherein the gas includes one of a hydrogen gas and a noble gas.

5. The method of claim 1, wherein the heating heats the workpiece so that the temperature of the workpiece falls within a range of 160 degrees C. or more to 180 degrees C. or less.

* * * * *